United States Patent [19]
Tsuchida et al.

[11] Patent Number: 5,936,288
[45] Date of Patent: Aug. 10, 1999

[54] SEMICONDUCTOR INTEGRATED CIRCUIT DEVICE AND LOW BREAKDOWN VOLTAGE ZENER DIODE

[75] Inventors: Kazuhito Tsuchida; Kouji Kashimoto; Satoshi Kadono, all of Tokyo, Japan

[73] Assignees: Mitsubishi Denki Kabushiki Kaisha; Kyoei Sangyo Co. Ltd., both of Tokyo, Japan

[21] Appl. No.: 08/987,377

[22] Filed: Dec. 9, 1997

[30] Foreign Application Priority Data

Jul. 8, 1997 [JP] Japan ................................. 9-182466

[51] Int. Cl.[6] .................................................. H01L 29/76
[52] U.S. Cl. ...................... 257/370; 257/378; 257/328; 257/530; 438/328
[58] Field of Search ................................... 257/370, 378

[56] References Cited

U.S. PATENT DOCUMENTS

| | | | |
|---|---|---|---|
| 4,451,839 | 5/1984 | Nelson | 357/13 |
| 4,758,537 | 7/1988 | Jennings | 437/164 |
| 5,648,281 | 7/1997 | Williams et al. | 437/33 |
| 5,691,554 | 11/1997 | Matthews | 257/328 |

FOREIGN PATENT DOCUMENTS

| | | |
|---|---|---|
| 57-198665 | 12/1982 | Japan . |
| 58-218139 | 12/1983 | Japan . |
| 59-191371 | 10/1984 | Japan . |
| 60-45051 | 3/1985 | Japan . |
| 1122153 | 5/1989 | Japan . |
| 613630 | 1/1994 | Japan . |

*Primary Examiner*—Olik Chaundhuri
*Assistant Examiner*—Douglas A. Wille
*Attorney, Agent, or Firm*—Leydig, Voit & Mayer, Ltd.

[57] ABSTRACT

Anode and cathode regions at a principal surface of a semiconductor substrate have the same characteristics as source and drain regions of a P type MOS transistor. A cathode region is superposed partially on the anode region at the principal surface of the semiconductor substrate, the cathode region having the same characteristics as source and drain regions of an N type MOS transistor. The cathode and anode regions form a Zener diode. The Zener diode may be short-circuited by a large current flow, i.e., zapping, or used as a voltage regulator.

14 Claims, 14 Drawing Sheets

SEMICONDUCTOR INTEGRATED CIRCUIT DEVICE AND LOW BREAKDOWN VOLTAGE ZENER DIODE

BACKGROUND OF THE INVENTION

1. Field of the Invention

The present invention relates to a novel semiconductor integrated circuit device comprising zapping Zener diodes besides P and N type MOS transistors, and to a Zener diode having a low breakdown voltage.

2. Background Art

There has been a growing need in recent years for semiconductor integrated circuit devices, comprising P type and N type MOS transistors, which incorporate resistance elements of very high precision that cannot be attained by a semiconductor wafer process. Such resistance elements with resistances of very high precision are produced conventionally by laser trimming in a test process following semiconductor wafer processing.

The laser trimming method will now be described with reference to FIGS. 22 through 24. In FIG. 22, reference character A represents a node on one side of a resistance element expected to offer a resistance of very high precision, and B denotes a node on the other side of the resistance element. A resistance of a very high precision is required between the two nodes.

Reference numeral 100 represents a resistance body which has a resistance R0, and one end of which is connected to the node A on one side of the resistance element. The resistance body 100 is a resistance constituted by a doped region at a principal surface of a semiconductor substrate including P and N type MOS transistors. Reference numeral 101 indicates a first adjusting resistance having a resistance R1 and connected between the resistance body 100 and the node B of the resistance element. The first adjusting resistance 101 is constituted by a doped region at the principal surface of the semiconductor substrate. In this example, the resistance R1 is set illustratively to $1/100$ of the resistance R0 of the resistance body 100.

Reference numeral 102 represents a second adjusting resistance having a resistance R2, and one end connected to the resistance body 100. The second adjusting resistance 102 is a diffusion resistance constituted by a diffusion region at the principal surface of the semiconductor substrate. In this example, the resistance R2 is set illustratively to $1/100$ of the resistance R0 of the resistance body 100. Reference numeral 103 represents a first fuse element F1 connected between the second adjusting resistance 102 and the node B. The first fuse element 103 is constituted by polysilicon or aluminum wiring on the principal surface of the semiconductor substrate.

Reference numeral 104 denotes a third adjusting resistance having a resistance R3, and connected to the resistance body 100. The third adjusting resistance 104 is a resistance constituted by a doped region at the principal surface of the semiconductor substrate. In this example, the resistance R3 is set illustratively to $1/100$ of the resistance R0 of the resistance body 100. Reference numeral 105 denotes a second fuse element F2 connected between the third adjusting resistance 103 and the node B. The second fuse element 105 is constituted by polysilicon or aluminum wiring on the principal surface of the semiconductor substrate. Because the first and the second fuse elements 103 and 105 are polysilicon or aluminum wiring, their resistances are negligible compared with those of the resistance body 100 and of the first through the third adjusting resistances 101, 102, and 104.

How the resistances of the resistance element above are set will now be described. With the wafer processing completed, a resistance R00 between the node A and the node B is measured. The resistance R00 at this point is defined by the expression (1):

$$R00 = R0 + R1 \cdot R2 \cdot R3 / (R2 \cdot R3 + R1 \cdot R3 + R1 \cdot R2) \quad (1)$$

The setting is complete when the resistance R00 has reached a desired level.

If the desired resistance value has yet to be reached, the first fuse element 103 is cut, i.e., electrically opened, using laser light. With the first fuse element 103 cut, the resistance R10 between the node A and the node B is measured. The resistance value R10 at this point is defined by the expression (2):

$$R10 = R0 + R1 \cdot R3 / (R3 + R1) > R00 \quad (2)$$

The setting is complete when the resistance R10 has reached the desired level.

If the desired resistance value has yet to be reached, the second fuse element 105 is also cut using laser light. With the second fuse element 105 cut, a resistance R20 between the node A and the node B is measured. The resistance value R20 at this point is defined by the expression (3):

$$R20 = R0 + R1R > R10 > R00 \quad (3)$$

This completes the setting of the resistance. The resistance element should now have a resistance very close to the desired value (i.e., design value).

However, the trouble with the fine tuning of a resistance value outlined above is that the process requires the use of a laser trimmer, a large and expensive machine.

SUMMARY OF THE INVENTION

It is therefore an object of the present invention to overcome the disadvantages of the prior art and to provide a semiconductor integrated circuit device which, comprising P type and N type MOS transistors, includes a resistance element having a resistance set with very high precision without recourse to a laser trimmer.

It is another object of the present invention to provide a Zener diode having a low breakdown voltage.

According to one aspect of the present invention, a semiconductor integrated circuit device comprises a semiconductor substrate having a principal surface, a P type MOS transistor having P type source and drain regions in the semiconductor substrate at the principal surface. An N type MOS transistor having N type source and drain regions at the principal surface. A zapping diode has an anode region and a cathode region. The anode region is located at the principal surface of the semiconductor substrate and has an impurity concentration and a diffusion depth the same as those of the P type source and drain regions of the P type MOS transistor. The cathode region is an N type region at the principal surface of the semiconductor substrate and having an impurity concentration and diffusion depth the same as the N type source and drain regions of the N type MOS transistor. The cathode region is partially superposed on the anode region. Further, a zapping anode pad is located on the principal surface of the semiconductor substrate and connected electrically to the anode region of the diode, and a zapping cathode pad is located on the principal surface of the semiconductor substrate and connected electrically to the cathode region of the diode.

In the semiconductor integrated circuit, one of the anode region and the cathode region may be narrower than the other region where they are partially superposed on each other.

In the semiconductor integrated circuit, one of the anode region and the cathode region may have a contact region for electrical connection and a tapered PN junction forming region extending from the contact region over the principal surface of the semiconductor substrate. The other one of the anode region and the cathode region has a contact region for electrical connection and a PN junction forming region extending from the contact region over the principal surface of the semiconductor substrate and partially superposed on the PN junction forming region of the first region.

In the semiconductor integrated circuit, the anode region and the cathode region of the diode each have a rectangular surface. One of the anode region and the cathode region is narrower than the other region where they are partially superposed on each other. Further, the partial superposition is effected perpendicularly to the widths of the regions.

In the semiconductor integrated circuit, the anode region and the cathode region of the diode each have a rectangular shape. The anode region and the cathode region are partially superposed on each other in a transversely staggered manner. Further, the partial superposition is effected perpendicular to the direction of widths of the regions.

In the semiconductor integrated circuit, the diode is made of a plurality of diodes corresponding to a plurality of cathode regions constituting the cathode region. Each of the cathode regions is disposed at the principal surface and is partially superposed on the anode region common to the plurality of diodes parts.

According to another aspect of the present invention, a Zener diode comprises a semiconductor substrate having a principal surface, a P type anode region at the principal surface of the semiconductor substrate, and an N type cathode region partially superposed on the anode region at the principal surface of the semiconductor substrate. Further, one of the anode region and the cathode region is narrower than the region where they are partially superposed on each other.

According to another aspect of the present invention, a Zener diode comprises a semiconductor substrate having a principal surface, a P type anode region at the principal surface of the semiconductor substrate, and an N type cathode region partially superposed on the anode region at the principal surface of the semiconductor substrate. A first PN junction is formed between the partially superposed region and one of the anode region and the cathode region. Further, a second PN junction is located where the anode region and the cathode region are not superposed on each other.

In the Zener diode, one of the anode region and the cathode region has a plane including a tapered portion superposed on the other. The second PN junction is located at an edge of a boundary between the regions, in the tapered portion.

The Zener diode may include a P type anode region in a well region of a P type semiconductor substrate which has an isolation oxide film on a principal surface and an N type well region surrounded by the isolation oxide film. An N type cathode region is partially superposed on the anode region in the well region, extends in a first direction, and has an impurity concentration level higher than that of the well region. One of the anode region and the cathode region has a first side exposed to the well region. The first exposed side extends in the first direction and is in contact with the isolation oxide film.

The other of the anode region and the cathode region has a second side exposed to the well region and a side portion extending in the partially superposed region. The second exposed side extends along the first direction, along the first exposed side in contact with the isolation oxide film in the one region, and positioned inside of the isolation oxide film in a second direction, perpendicular to the first direction, so that the well region will have an exposed surface.

Other features and advantages of the invention will be apparent from the following description taken in connection with the accompanying drawings.

DETAILED DESCRIPTION OF PREFERRED EMBODIMENTS

Figure 1:
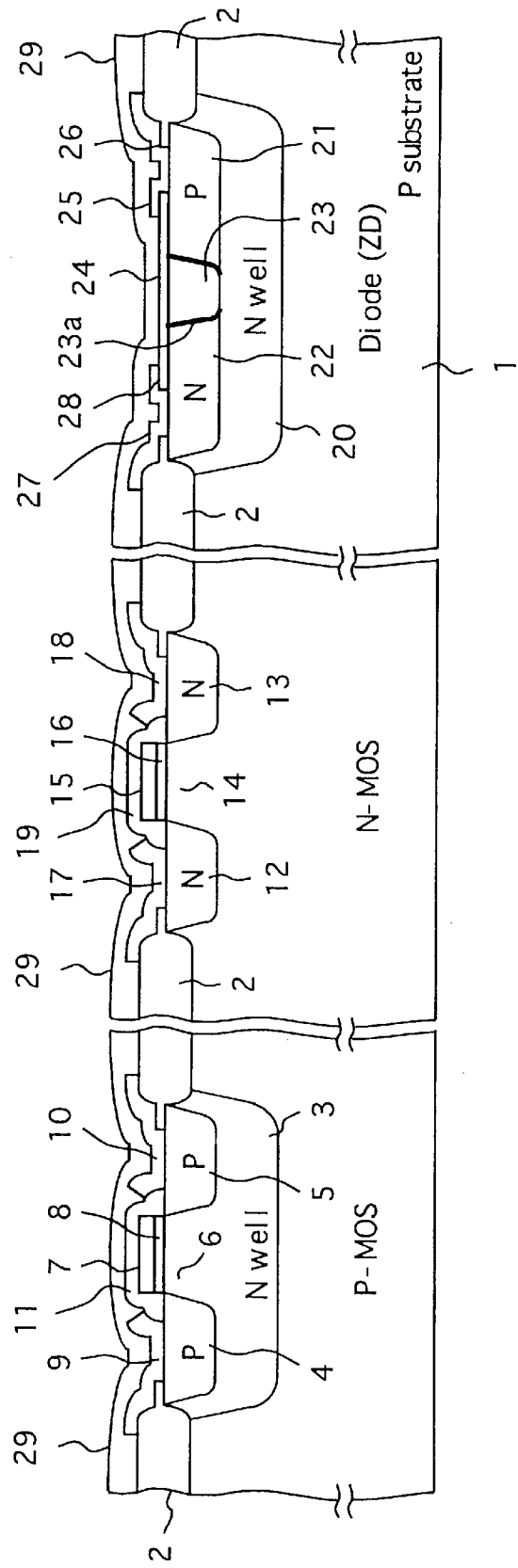
FIG. 1 is a cross sectional view showing a construction of a semiconductor integrated circuit device according to a first embodiment of the present invention.

The present invention will become more apparent from the following detailed description with reference to the figures, in which same reference numerals denote the same or corresponding parts.

First Embodiment

FIGS. 1 through 9 depict a first embodiment of the present invention. In FIG. 1, reference numeral 1 represents a P type semiconductor substrate with a resistance of, for example, 200 Ωcm. Because the semiconductor substrate 1 is used to provide a substrate potential to N type MOS transistors, the substrate 1 of the first embodiment is grounded. Reference numeral 2 represents an isolation oxide film surrounding each element-forming region on a principal surface of the semiconductor substrate 1. The isolation oxide film 1 is generally formed by the known LOCOS method.

Reference numeral 3 indicates an N type well region for PMOS transistors. The N type well region 3 is disposed in a P type MOS transistor-forming region surrounded by the isolation oxide film 2. Illustratively, the well region 3 is formed by implanting phosphorus (P) ions at an energy of 150 keV and a dosage of $3 \times 10^{12}/cm^2$. Because the well region 3 for PMOS transistors is intended to provide a substrate potential to the PMOS transistors, the well region 3 of the first embodiment is fed with a positive potential. Reference numerals 4 and 5 denote source and drain regions located at the principal surface of the semiconductor substrate 1 in the PMOS well region, with a channel region 6 interposed between the source and drain regions. The source and drain regions 4 and 5 are P type regions formed, illustratively, by implanting boron ions (B) at an energy of 50 keV and a dosage of $4 \times 10^{15}/cm^2$.

Reference numeral 7 stands for a gate electrode located on the channel region 6 opposite the principal surface of the semiconductor substrate 1, with a gate oxide film 8 interposed between the gate electrode 7 and the channel region 6. The gate electrode 7 is polysilicon and, combined with the source and drain regions 4 and 5, constitutes a P type MOS transistor. Reference numerals 9 and 10 represent source and drain leads (electrodes) respectively connected electrically to the source and drain regions 4 and 5. The source and drain leads 9 and 10 are an aluminum layer and are insulated electrically from the gate electrode 7 by an insulating film (oxide film) 11.

Reference numerals 12 and 13 denote source and drain regions in an N type MOS transistor-forming region surrounded by the isolation oxide film 2 at the principal surface of the semiconductor substrate 1, with a channel region 14 interposed between the source and drain regions. Illustratively, the source and drain regions 12 and 13 are N type regions formed by implanting phosphorus ions (P) at an energy of 40 keV and a dosage of $6 \times 10^{14}/cm^2$.

Reference numeral 15 indicates a gate electrode located on a channel region 14 above the principal surface of the semiconductor substrate 1, with a gate oxide film 16 interposed between the gate electrode 15 and the channel region 14. The gate electrode 15 is polysilicon and, combined with the source and drain regions 12 and 13, constitutes an N type MOS transistor. Reference numerals 17 and 18 represent source and drain leads (electrodes) respectively electrically in contact with the source and drain regions 12 and 13 (i.e., ohmic contacts). The source and drain leads 17 and 18 are made from the same aluminum layer that forms the source and drain leads 9 and 10 for the P type MOS transistor. The source and drain leads 17 and 18 are electrically insulated from each other by an insulating film (oxide film) 19. The insulating film (oxide film) 19 and the insulating film (oxide film) 11 are fabricated concurrently.

Reference numeral 20 represents a well region for N type diodes. A diode-forming region surrounded by the isolation oxide film 2 includes the well region 20 that is formed at the same time as the PMOS well region 3, under the same conditions, illustratively, through implantation of phosphorus ions (P) at an energy of 150 keV and a dosage of $3 \times 10^{12}/cm^2$. Because the diode well region 20 is intended to isolate Zener diodes electrically from the semiconductor substrate 1, the region 20 is not fed with ground or a negative potential. The diode well region 20 is electrically connected to a cathode region 22, as described later.

Figure 2:
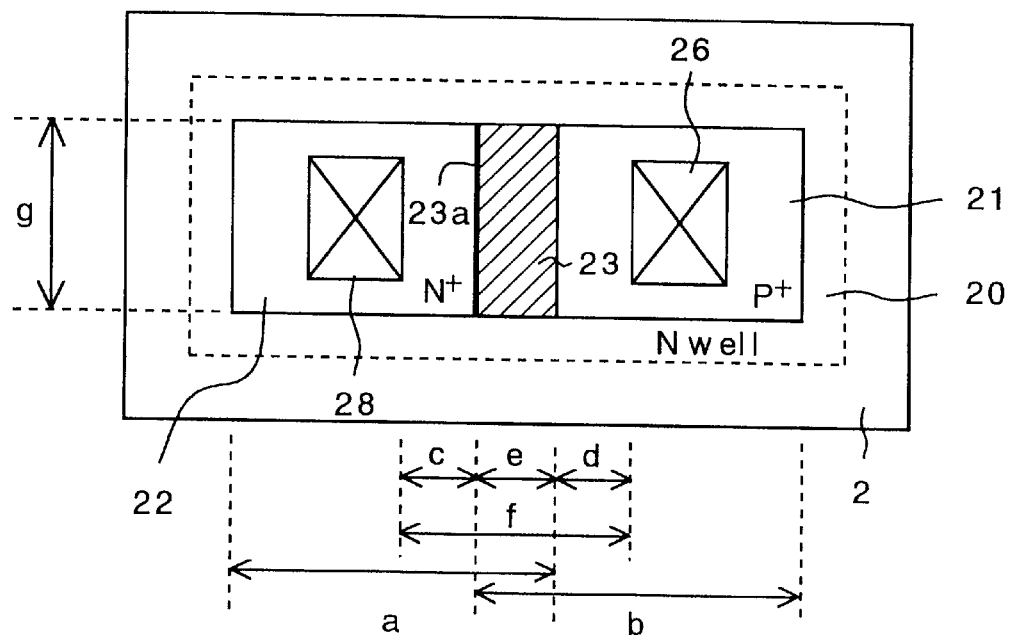
FIG. 2 is a plan view showing a construction of a Zener diode according to the first embodiment of the present invention.

Reference numeral 21 represents an anode region, a P type region which has the same impurity concentration and the same depth as the P type region making up the source and drain regions 4 and 5 of the P type MOS transistor, at the principal surface of the semiconductor substrate 1, the P type region further having a higher impurity concentration than the semiconductor substrate 1. The anode region 21 is formed at the same time as the source and drain regions 4 and 5 of the P type MOS transistor, under the same conditions, illustratively, through implantation of boron ions (B) at an energy of 50 keV and a dosage of $4 \times 10^{15}/cm^2$. As shown in FIG. 2, the anode region 21 has a rectangular shape, and three sides of the region 21 exposed to the diode well region 20 (exposed PN junction sides) are in contact with the isolation oxide film 2. That is, in the process of ion implantation for fabricating the anode region 21, the isolation oxide film 2 is utilized as part of the mask.

Reference numeral 22 denotes a cathode region, an N type region which extends in a first direction (i.e., in the transverse direction in FIG. 2), sharing a partially superposed region 23 with the anode region 21. The N type region has the same impurity concentration and the same depth as the N type region constituting the source and drain regions 12 and 13 of the N type MOS transistor. Furthermore, the N type region has a higher impurity concentration than the diode well region 20. The cathode region 22 is formed at the same time as the source and drain regions 12 and 13 of the N type MOS transistor and under the same conditions, illustratively, through implantation of phosphorus ions (P) at an energy of 40 keV and a dosage of $6 \times 10^{14}/cm^2$.

The cathode region 22 and the anode region 21 combine to form a zapping Zener diode. As depicted in FIG. 2, the cathode region 21 has a rectangular shape, and three sides of the region 21 exposed to the diode well region 20 (exposed $N^+N$ junction sides) are in contact with the isolation oxide film 2. That is, in the process of ion implantation for fabricating the cathode region 22, the isolation oxide film 2 is utilized as part of the mask.

The superposed region 23 between the anode and cathode regions 21 and 22 is P type. This is because the anode region 21 is higher in impurity concentration than the cathode region 22 in the first embodiment. It follows that the PN junction of the Zener diode formed by the anode and cathode regions 21 and 22 constitutes a $PN^+$ junction 23a between the P type superposed region 23 (shown by thick lines in FIGS. 1 and 2) and the $N^+$ type cathode region 22.

Figure 4:
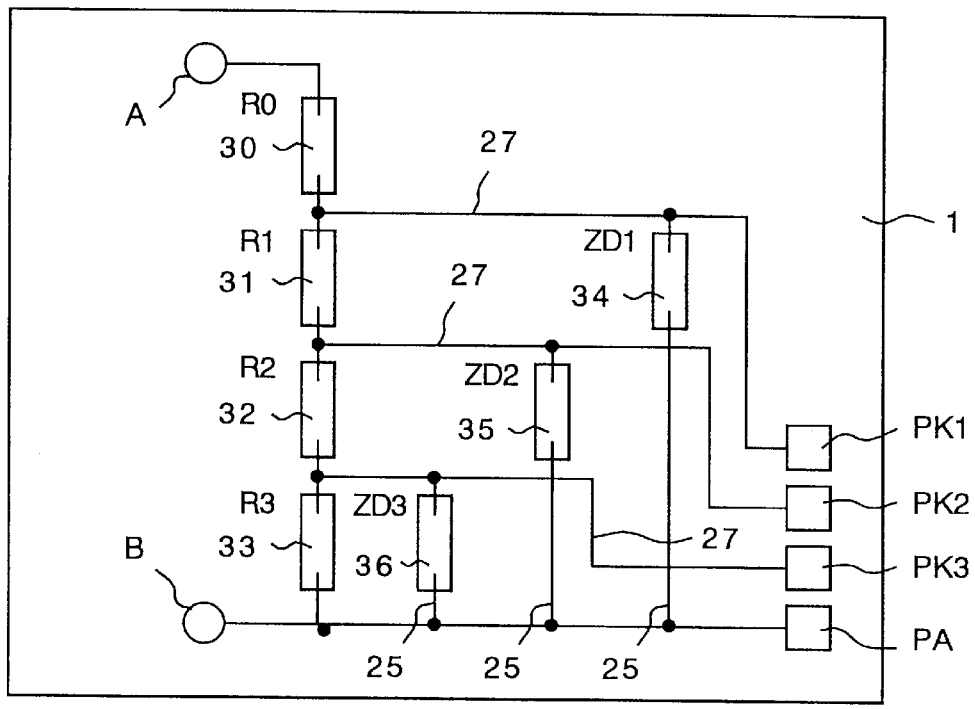
FIG. 4 is a circuit diagram of a plurality of Zener diodes and resistance elements included in a semiconductor integrated circuit device according to the first embodiment of the present invention.

Reference numeral 24 stands for an insulating film (oxide film) on the principal surface in the diode well region 20. The insulating film (oxide film) 24 is in the same layer as the insulating films (oxide films) 11 and 19; these films are fabricated concurrently. Reference numeral 25 indicates an anode lead (electrode) connected electrically (through ohmic contact) with the anode region 21 via a contact hole 26 in the insulating film 24. The anode lead 25 is formed simultaneously with the source and drain leads 9 and 10 of the P type MOS transistor. As shown in FIG. 4, the anode lead 25 is connected electrically to a zapping anode pad PA at the periphery at the principal surface of the semiconductor substrate 1.

Reference numeral 27 represents a cathode lead (electrode) electrically connected (through ohmic contact) to the cathode region 22 via a contact hole 28 in the insulating film 24. The cathode lead 27 is formed simultaneously with the aluminum layer of the anode lead 25. As shown in FIG. 4, the cathode lead 27 is electrically connected to a zapping cathode pad PK at the periphery of the principal surface of the semiconductor substrate 1. Reference numeral 29 denotes an insulating film disposed over the P type MOS transistor, N type MOS transistor, and Zener diode. The insulating film 29 is an interlayer insulating film such as a BPSG film and/or a surface protecting film such as a silicon nitride film (SiN).

In the first embodiment, the Zener diode including the anode and cathode regions 21 and 22 has an exposed shape with dimensions determined illustratively as follows: the cathode region 22 and the anode region 21 are each 20 μm long in the first direction in FIG. 2 (lengths "a" and "b"), and are 20 μm wide each in the second direction perpendicular to the first direction (width "g"). The length (distance) "c" between the contact hole 28 and the anode region 21 in the first direction is 8 μm, the same as the length (distance) "d" between the contact hole 26 and the cathode region 22, also in the first direction.

The superposed region 23 between the anode and cathode regions 21 and 22 is 3 μm long in the first direction (length "e"). The length (distance) "f" between the contact holes 26 and 28 is 19 μm in the first direction. The contact holes 26 and 28 are each 5 μm long in the first direction and 10 μm wide in the second direction.

Figure 3:
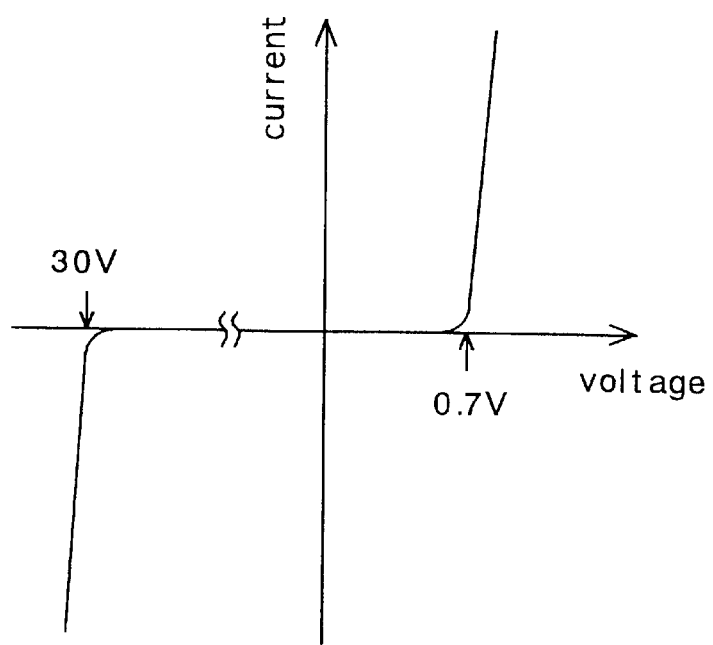
FIG. 3 shows a characteristic of the Zener diode shown in FIG. 3.

When measured, the Zener diode with these dimensions yielded characteristics shown in FIG. 3. As illustrated graphically, the Zener diode has a forward voltage of 0.7 V and a breakdown voltage of 30 V (backward withstand voltage). The voltage characteristics are low enough for the Zener diode to serve as a zapping diode. In one experiment, large currents (specifically, currents between 50 mA and 100 mA) were made to flow from the zapping cathode pad PK to the zapping anode pad PA. The current flow short-circuited the cathode lead 27 to the anode lead 25 of the Zener diode. More specifically, the flow of a large current from the cathode lead 27 to the anode lead 25 melted the aluminum of the cathode lead 27, forming an aluminum-silicon (AlSi) layer over the surface ranging from the cathode region 22 (in contact with the cathode lead 27) to the anode region 21 (in contact with the anode lead 25). The aluminum-silicon layer thus short-circuited the cathode lead 27 to the anode lead 25.

In the case described above, the resistance was measured as follows: with gold leads connected to the zapping cathode pad PK and to the zapping anode pad PA and with currents made to flow through the gold leads, a voltage between the two pads was measured. The measured resistance was as low as 10 Ω. The 10 Ω resistance includes the resistance of the gold lead, the contact resistances between the gold leads on the zapping cathode pad PK and on the zapping anode pad PA, the resistances of the cathode lead 27 and the anode lead 25, the contact resistance between the cathode lead 27 and the cathode region 22, and the contact resistance between the anode wiring 25 and the anode region 21. This means that the resistance between the cathode lead 27 and the anode lead 25 is as low as a few ohms, the two leads being in a practically short-circuited state. The Zener diode structured as described is thus appropriate as a zapping diode.

Figure 5:
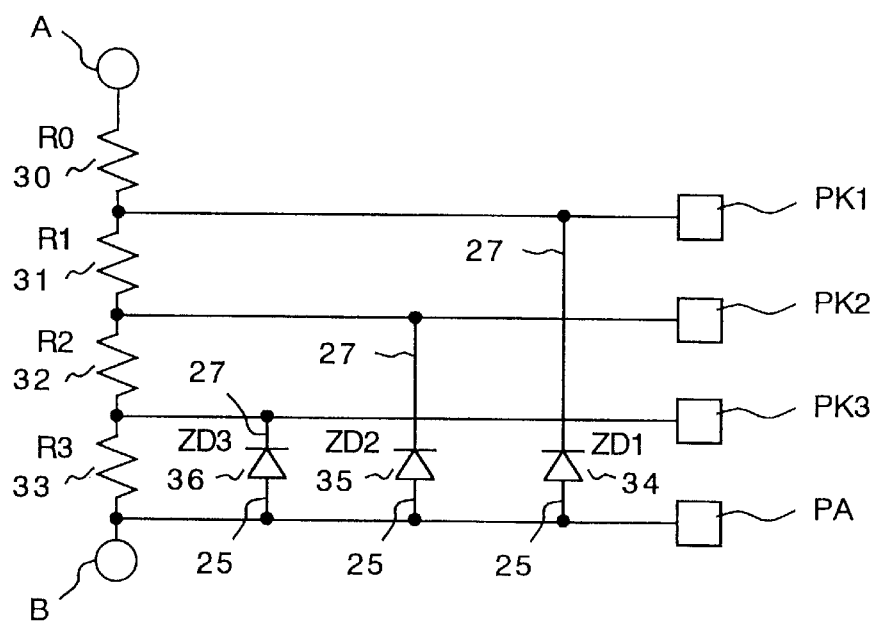
FIGS. 5, 6, 7, and 8 show an initial and first to third states of the circuit shown in FIG. 4.

Described below with reference to FIGS. 4 through 8 is a method of producing, by using zapping diodes, a resistance element having a resistance set with very high precision in the semiconductor integrated circuit device outlined above. In FIGS. 4 and 5, reference character A stands for a node on one side of a resistance element expected to provide a resistance of very high precision, and B denotes a node on the other side of the resistance element. A resistance of very high precision is required between the nodes A and B.

Reference characters PK1 represent a first zapping cathode pad at the periphery of the principal surface of the semiconductor substrate 1 having the P type MOS transistor (PMOS shown in FIG. 1), N type MOS transistor (NMOS in FIG. 1), and Zener diode (ZD in FIG. 1) disposed thereon. Reference characters PK2 denote a second zapping cathode pad at the periphery of the principal surface of the semiconductor substrate 1. Reference characters PK3 represent a third zapping cathode pad at the periphery of the principal surface of the semiconductor substrate 1. Reference characters PA indicate a zapping anode pad at the periphery on the principal surface of the semiconductor substrate 1.

Reference numeral 30 denotes a resistance body which has a resistance R0 and one end of which is connected to the node A on one side of the resistance element. The resistance body 30 is a resistance constituted by a region at the principal surface of the semiconductor substrate 1.

Reference numeral 31 denotes a first adjusting resistance which has a resistance R1 and one end of which is connected to the resistance body 30. The first adjusting resistance 31 is a diffusion resistance constituted by a region at the principal surface of the semiconductor substrate 1. In this example, the resistance R1 is set illustratively to 1/100 of the resistance R0 of the resistance body 30.

Reference numeral 32 represents a second adjusting resistance which has a resistance R2 and one end of which is connected to the first adjusting resistance 31. The first adjusting resistance 32 is a resistance constituted by a region at the principal surface of the semiconductor substrate 1. In this example, the resistance R2 is set illustratively to 1/100 of the resistance value R0 of the resistance body 30.

Reference numeral 33 represents a third adjusting resistance which has a resistance R3, one end of which is connected to the second adjusting resistance 32, and the other end of which is connected to the node B on the other side of the resistance element. The third adjusting resistance 33 is a resistance constituted by a region at the principal surface of the semiconductor substrate 1. In this example, the resistance value R3 is set illustratively to 1/100 of the resistance R0 of the resistance body 30. The resistance body 30 and the first through the third adjusting resistances 31 through 33 are connected in series between the nodes A and B as the resistance element.

Reference numeral 34 indicates a first zapping diode ZD1 having the cathode region 22 and anode region 21, wherein the cathode region 22 is connected via the cathode lead 27 to the resistance body 30 and to the first zapping cathode pad PK1, and the anode region 21 is connected via the anode lead 25 to the node B and to the zapping anode pad PA. The first zapping diode 34 is located at the principal surface of the semiconductor substrate 1 and has the structure of the Zener diode (ZD) shown in FIG. 1.

Reference numeral 35 indicates a second zapping diode ZD2 having the cathode region 22 and anode region 21, wherein the cathode region 22 is connected via the cathode lead 27 to the first adjusting resistance 31 and to the second zapping cathode pad PK2, and wherein the anode region 21 is connected via the anode lead 25 to the node B and to the zapping anode pad PA. The second zapping diode 35 is located at the principal surface of the semiconductor substrate 1 and also has the structure of the Zener diode (ZD) shown in FIG. 1.

Reference numeral 36 represents a third zapping diode ZD3 having the cathode region 22 and anode region 21, wherein the cathode region 22 is connected via the cathode lead 27 to the second adjusting resistance 32 and to the third zapping cathode pad PK, and wherein the anode region 21 is connected via the anode lead 25 to the node B and to the zapping anode pad PA. The third zapping diode 36 is located at the principal surface of the semiconductor substrate 1 and also has the structure of the Zener diode (ZD) depicted in FIG. 1.

A method for setting the resistance of the resistance element structured as outlined above will now be described. With the wafer processing completed, the resistance R00 between the node A on one side of the resistance element and the node B on the other side is first measured. The resistance R00 at this point is defined by the expression (4):

$$R00 = R0 + R1 + R2 + R3 \quad (4)$$

The setting is complete when the resistance value R00 has reached a desired level.

Figure 6:
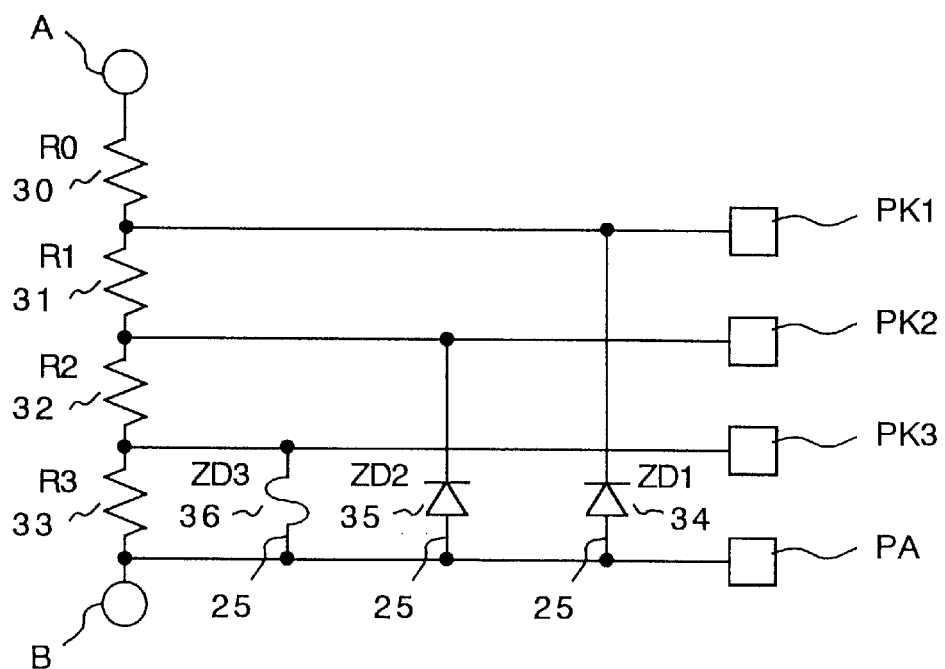

If the desired resistance has yet to be reached, a large current is made to flow from the third zapping cathode pad PK to the zapping anode pad PA to bring about a short-circuited state between the cathode and anode leads of the third zapping diode 36. That is, as shown in FIG. 6, the ends of the third adjusting resistance 33 are practically short-circuited to each other. With the two ends of the third adjusting resistance 33 thus short-circuited, the resistance value R10 between the node A on one side of the resistance element and the node B on the other side is measured. The resistance R10 at this point is defined by the expression (5):

$$10 = R0 + R1 + R2 < R00 \quad (5)$$

The setting is complete when the resistance R10 has reached the desired level.

Figure 7:
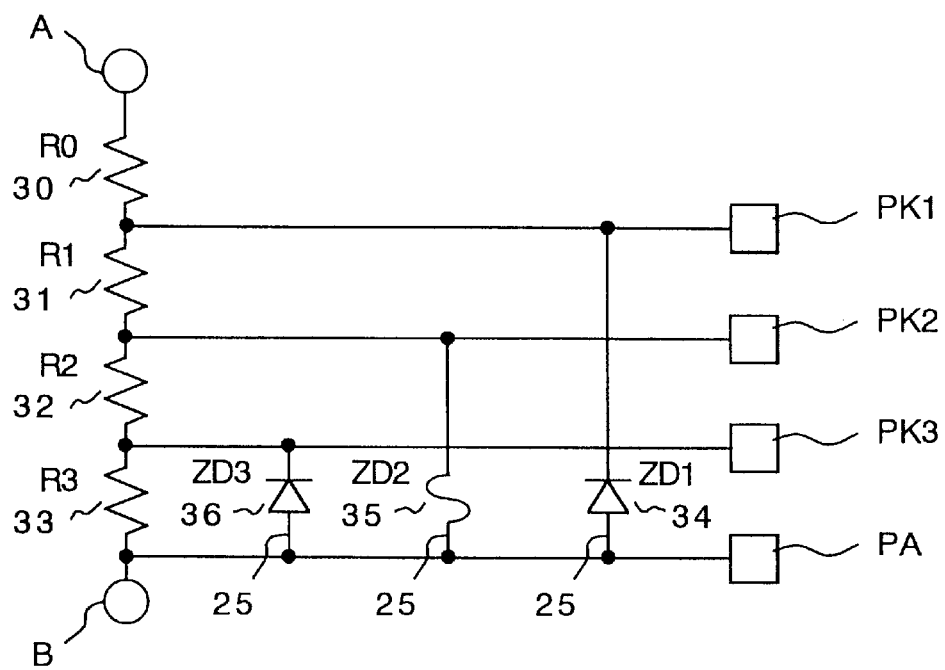

If the desired resistance value has yet to be reached, another large current is made to flow from the second zapping cathode pad PK2 to the zapping anode pad PA to bring about a short-circuited state between the cathode and anode leads of the second zapping diode 35. That is, as shown in FIG. 7, the ends of the second and the third adjusting resistance 32 and 33 are practically short-circuited. With the two ends of the second and third adjusting resistances 32 and 33 thus short-circuited, the resistance R20 between the node A on one side of the resistance element and the node B on the other side is measured. The resistance R20 at this point is defined by the expression (6):

$$R20 = R0 + R1 < R10 < R00 \quad (6)$$

The setting is complete when the resistance R20 has reached the desired level.

Although FIG. 7 does not show the third zapping diode 36 in a practically short-circuited state, an alternative is for the third zapping diode 36 to be practically short-circuited first, followed by the second zapping diode 35. Depending on the resistance R00, the second zapping diode 35 may be directly brought into a practically short-circuited state. In any case, the resistance R20 will turn out to be substantially the same.

Figure 8:
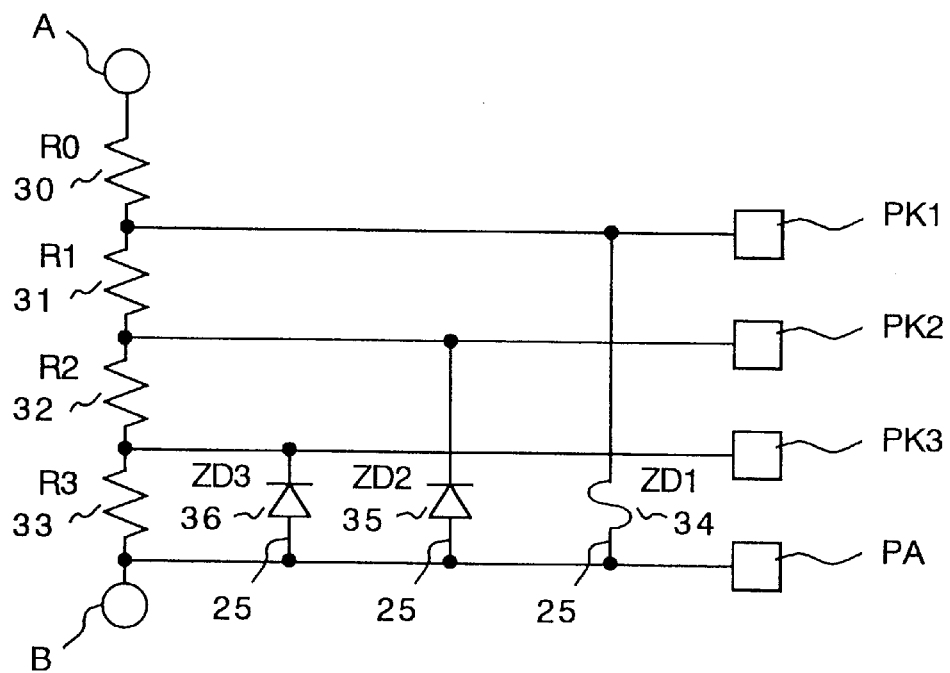

If the desired resistance has yet to be reached, yet another large current is made to flow from the first zapping cathode pad PK1 to the zapping anode pad PA to bring about a short-circuited state between the cathode and anode leads of the first zapping diode 34. That is, as shown in FIG. 8, both ends of the first through third adjusting resistances 31 through 33, are each practically short-circuited. With the ends of the first through the third adjusting resistances 31 through 33 thus short-circuited, the resistance R30 between the node A on one side of the resistance element and the node B on the other side is measured. The resistance R30 at this point is defined by the expression (7):

$$R30 = R0 < R00 < R10 < R00 \quad (7)$$

This completes the setting of the resistance. The resistance element now has a resistance very close to the desired value (i.e., design value).

Although FIG. 8 does not show the second and the third zapping diodes 35 and 36 in a practically short-circuited state, as an alternative, the second and the third zapping diodes 35 and 36 are practically short-circuited first, followed by the first zapping diode 34. Depending on the resistance R00, the first zapping diode 34 may be directly brought into a practically short-circuited state. In any case, the resistance R30 will be substantially the same.

In the semiconductor integrated circuit device described and comprising P and N type MOS transistors, the first embodiment allows zapping diodes to be fabricated at the same time as the P and N type MOS transistors are fabricated without any additional fabrication processes. The first embodiment thus offers the benefit of incorporating resistance elements having resistances are set at very high levels of precision.

In the first embodiment, the source and drain regions 4 and 5 of the P type MOS transistors are higher in impurity concentration than the source and drain regions 12 and 13 of the N type MOS transistors. Alternatively, the source and drain regions 12 and 13 of the N type MOS transistors may have a higher impurity concentration than the source and drain regions 4 and 5 of the P type MOS transistors. Alternatively, the cathode region 22 of the zapping diode (ZD) is higher in impurity concentration than the anode region 21. This causes the superposed region 23 between the anode and cathode regions 21 and 22 to become N type. As a result, the PN junction of the Zener diode including the anode and cathode regions 21 and 22 is a P$^+$N junction between the N type superposed region 23 and the P$^+$ type anode region 21. The alternative construction still offers the same benefit as the first embodiment.

The first embodiment incorporates P and N type MOS transistors. Alternatively, the present invention may also be applied to a BiCMOS circuit, comprising bipolar and MOS transistors. In the latter case, zapping diodes may be used not to adjust the resistances of resistance elements but to determine the use or nonuse of bipolar transistors 37, as shown in FIG. 9.

Figure 9:
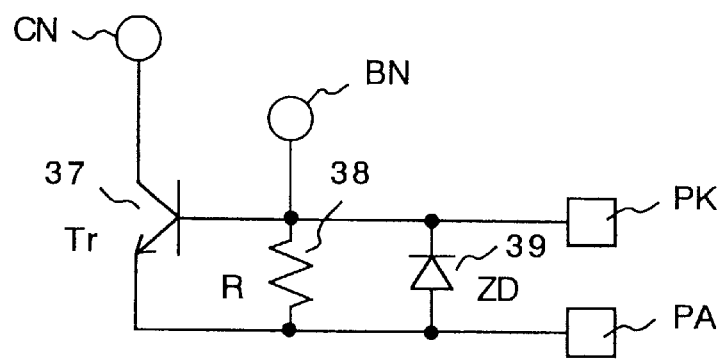
FIG. 9 is a circuit diagram of a Zener diode applied to a transistor according to the first embodiment of the present invention.

In FIG. 9, reference numeral 38 represents a resistance connected between the base and emitter of an npn bipolar transistor 37. Where the bipolar transistor 37 is utilized, a zapping diode 39 is left intact. Because the backward withstand voltage of the zapping diode 39 is high, the bipolar transistor 37 is left unaffected. Thus the bipolar transistor 37 acts in response to a signal input to a base node BN, outputting a signal to a collector node CN in accordance with the signal input to the base node BN.

Where the bipolar transistor 37 is not used, a large current is made to flow from the zapping cathode pad PK to the zapping anode pad PA to short-circuit the cathode and anode leads of the zapping diode 39, whereby the base and emitter of the bipolar transistor 37 are brought into a practically short-circuited state. As a result, the bipolar transistor 37 remains inactive, and the collector node CN maintains an electrically floating state, i.e., a high impedance state.

Second Embodiment

Figure 10:
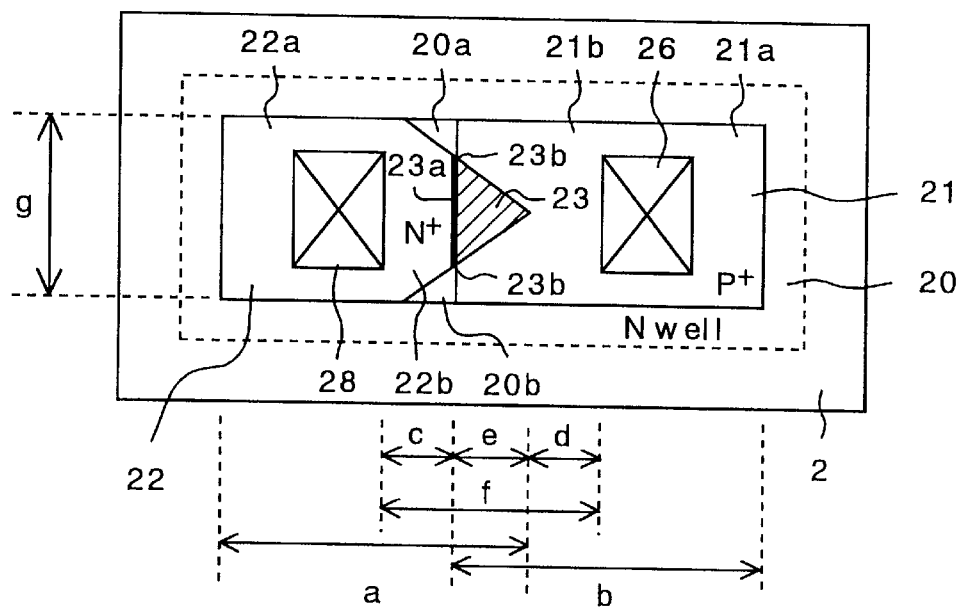
FIG. 10 is a plan view showing a construction of a Zener diode according to a second embodiment of the present invention.

FIG. 10 shows a second embodiment of the present invention. The second embodiment differs from the first embodiment solely in terms of the shape of the cathode region 22, i.e., the PN junction between the cathode and anode regions 22 and 21. The other aspects of the second embodiment are the same as those of the first embodiment. The difference between the two embodiments will be described below in detail. Of the reference numerals in FIG. 10, those already used in connection with the first embodiment designate like or corresponding parts.

Reference numeral 21 denotes a P type anode region which has the same impurity concentration and the same depth as the P type source and drain regions 4 and 5 of the P type MOS transistor at the principal surface of the semiconductor substrate 1, the P type region further having a higher impurity concentration than the semiconductor substrate 1. The anode region 21 is fabricated at the same time as the source and drain regions 4 and 5 of the P type MOS transistor and under the same conditions, illustratively, through implantation of boron ions (B) at an energy of 50 keV and a dosage of $4 \times 10^{15}/cm^2$.

The anode region 21 has a contact region 21a and a PN junction forming region 21b. The contact region 21a is electrically connected to the anode lead 25 via a contact hole in the insulating film 24, and the PN junction forming region 21b extends from the contact region 21a in the first direction (transversely in FIG. 10) at the principal surface of the semiconductor substrate 1. The anode region 21 has a rectangular shape, with its three sides exposed to the diode well region 20 (exposed PN junction sides) and in contact with the isolation oxide film 2. That is, in the process of ion implantation for fabricating the anode region 21, the isolation oxide film 2 is utilized as part of the mask. It should be noted that the anode region 21 is the same as that of the first embodiment.

Reference numeral 22 is a cathode region constituted by an N type region which is formed in the first direction, sharing a partially superposed region 23 with the anode region 21 at the principal surface of the semiconductor substrate 1. The N type region has the same impurity concentration and the same depth as the N type region constituting the source and drain regions 12 and 13 of the N type MOS transistor. Furthermore, the N type region is higher in impurity concentration than the diode well region 20. The cathode region 22 is fabricated at the same time as the source and drain regions 12 and 13 of the N type MOS transistor and under the same conditions, illustratively, through implantation of phosphorus ions (P) at an energy of 40 keV a dosage of $6 \times 10^{14}/cm^2$.

The cathode region 22 has a contact region 22a, and a tapered PN junction forming region 22b that extends from the contact region 22a across the principal surface of the semiconductor substrate 1. The contact region 22a in the cathode region 22 has a rectangular shape, with three sides of the region 22a exposed to the diode well region 20 (exposed $N^+N$ junction sides) and in contact with the isolation oxide film 2. The PN junction forming region 22b of the cathode region 21 has a triangular shape, with two faces 20a and 20b exposed to the diode well region 20 (exposed $N^+N$ junction sides) and located inside the isolation oxide film 2 in the second direction (longitudinally in FIG. 10) perpendicular to the first direction. That is, in the process of ion implantation for fabricating the cathode region 22, the isolation oxide film 2 is utilized as the mask for forming the contact region 22a, and a commonly employed resist is utilized as the mask for fabricating the PN junction forming region 22b.

The superposed region 23 between the anode and cathode regions 21 and 22 is formed by the PN junction forming region 22b of the cathode region 22 and by a PN junction forming region 21b of the anode region 21. More specifically, the cathode region 22 is narrower than the anode region 21 where they are superposed on each other to form the Zener diode.

The superposed region 23 between the anode and cathode regions 21 and 22 is P type. This is because the anode region 21 is higher in impurity concentration than the cathode region 22 in the second embodiment. Thus the PN junction of the Zener diode made of the anode and cathode regions 21 and 22 is constituted by a $PN^+$ junction 23a (shown by thick line in FIG. 10) between the P type superposed region 23 and the $N^+$ type cathode region 22, and by a $P^+N^+$ junction 23b between the $P^+$ type anode region 21 and the $N^+$ type cathode region 22 located on both ends of the thick line in the figure.

In other words, the Zener diode including the anode and cathode regions 21 and 22 has both the $PN^+$ junction 23a between the superposed region 23 and the cathode region 22, and a high-density $P^+N^+$ junction 23b where the anode and cathode regions 21 and 22 are not superposed on each other, i.e., on the boundary between the PN junction forming region 22b, which is the tapered portion of the cathode region 22, and the PN junction forming region 21b of the anode region 21.

In the second embodiment, the Zener diode made of the anode and cathode regions 21 and 22 has an exposed shape having dimensions determined, illustratively, as follows: the anode region 21 is 20 μm long in the first direction (length "b") and 20 μm wide in the second direction (width "g"). The cathode region 22 is 20 μm long in the first direction, up to the PN junction forming region 22b (length "a"), and 20 μm wide in the second direction (width "g"). The contact region 22a in the cathode region 22 is 10 μm long in the first direction.

The length (distance) "c" in the first direction between the contact hole 28 and the anode region 21 is 8 μm, the same as the length (distance) "d" in the first direction between the contact hole 26 and the tip of the PN junction forming region 22b in the cathode region 22. The maximum length "e" of the superposed region 23 in the first direction between the anode and cathode regions 21 and 22 is 3 μm. The length (distance) "f" in the first direction between the contact holes 26 and 28 is 19 μm. The contact holes 26 and 28 are each 5 μm long in the first direction, and 10 μm wide in the second direction.

Figure 11:
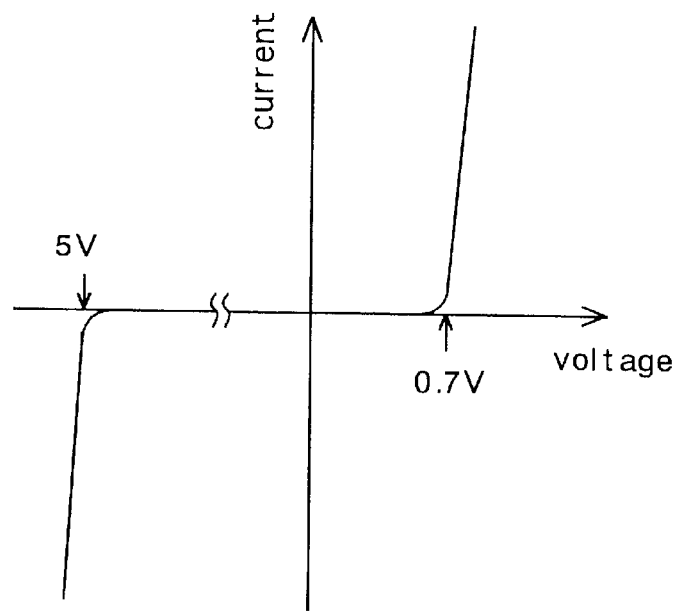
FIG. 11 shows a characteristic of the Zener diode shown in FIG. 10.

When measured, the Zener diode having these dimensions yielded characteristics shown in FIG. 11. As illustrated graphically, the Zener diode has a forward voltage of 0.7 V and a breakdown voltage as low as 5 V (backward withstand voltage). The significantly lower breakdown voltage is considered attributable to the high-density $P^+N^+$ junction 23b constituted by the $P^+$ type anode region 21 and $N^+$ type cathode region 22.

In an experiment, large currents (e.g., between 50 mA and 100 mA) were made to flow from the zapping cathode pad PK to the zapping anode pad PA. This, as with the first embodiment, brought about a short-circuited state of the cathode and anode leads of the Zener diode. The resistance measured at that point turned out to be the same as that in the first embodiment.

In the semiconductor integrated circuit device structured as described and comprising P and N type MOS transistors, the second embodiment permits fabrication of zapping diodes with a very low breakdown voltage at the same time as the P and N type MOS transistors are fabricated without any additional fabrication processes. The second embodiment also offers the benefit of incorporating resistance elements whose resistances are set at very high levels of precision.

In the second embodiment, the source and drain regions 4 and 5 of the P type MOS transistors are higher in impurity concentration than the source and drain regions 12 and 13 of the N type MOS transistors. Alternatively, the source and drain regions 12 and 13 of the N type MOS transistors may have a higher impurity concentration than the source and drain regions 4 and 5 of the P type MOS transistors.

In the alternative case, the cathode region 22 of the zapping diode is higher in impurity concentration than the anode region 21. This causes the superposed region 23 between the anode and cathode regions 21 and 22 to become N type. As a result, the PN junction of the Zener diode including the anode and cathode regions 21 and 22 has two kinds of junctions: a P$^+$N junction between the N type superposed region 23 and the P$^+$ type anode region 21, and a P$^+$N$^+$ junction 23$b$ between the P$^+$ type anode region 21 and the N$^+$ type cathode region 22 where the anode and cathode regions 21 and 22 are not superposed on each other. The alternative structure still offers the same effects as the second embodiment.

In the second embodiment, the anode region 21 has a rectangular shape and the cathode region 22 has the PN junction forming region 22$b$ with a tapered triangular shape. Conversely, the cathode region 22 may have a rectangular shape and the anode region 21 may possess the PN junction forming region 21$b$ with a tapered triangular shape. The alternative structure still provides the same effects as the second embodiment.

The Zener diode of the second embodiment, with its breakdown voltage as low as 5 V, is suitable not only as a zapping diode but also as a Zener diode for generating a reference voltage. Illustratively, as shown in FIG. 12, a Zener diode 41 of the second embodiment may provide a reference potential (i.e., reference voltage) to be fed to a non-inverting input terminal of a comparator 40 whose inverting input terminal is connected to an input terminal IN.

Figure 12:
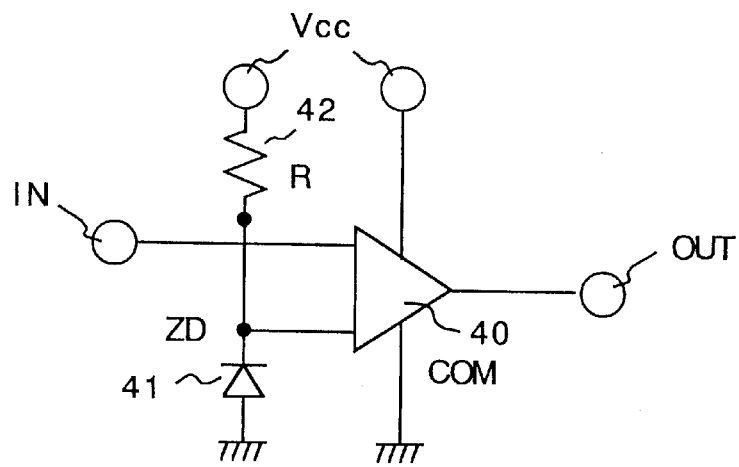
FIG. 12 is a circuit diagram of a Zener diode applied to a comparator as a reference potential according to the second embodiment of the present invention.

The Zener diode 41 in FIG. 12 has the structure depicted in FIG. 10. Specifically, the anode region 21 is connected to a ground potential node via the anode lead 27, and the cathode region 22 is electrically connected to the non-inverting input terminal of the comparator 40 via the anode lead 25. A resistance 42 is connected between a power supply potential node Vcc and the non-inverting input terminal of the comparator 40. When generating a reference potential, the Zener diode 41 is not destroyed because the current flowing from the cathode lead (electrode) 27 to the anode lead (electrode) 25 ranges from tens of $\mu$A to 1 mA.

Third Embodiment

Figure 13:
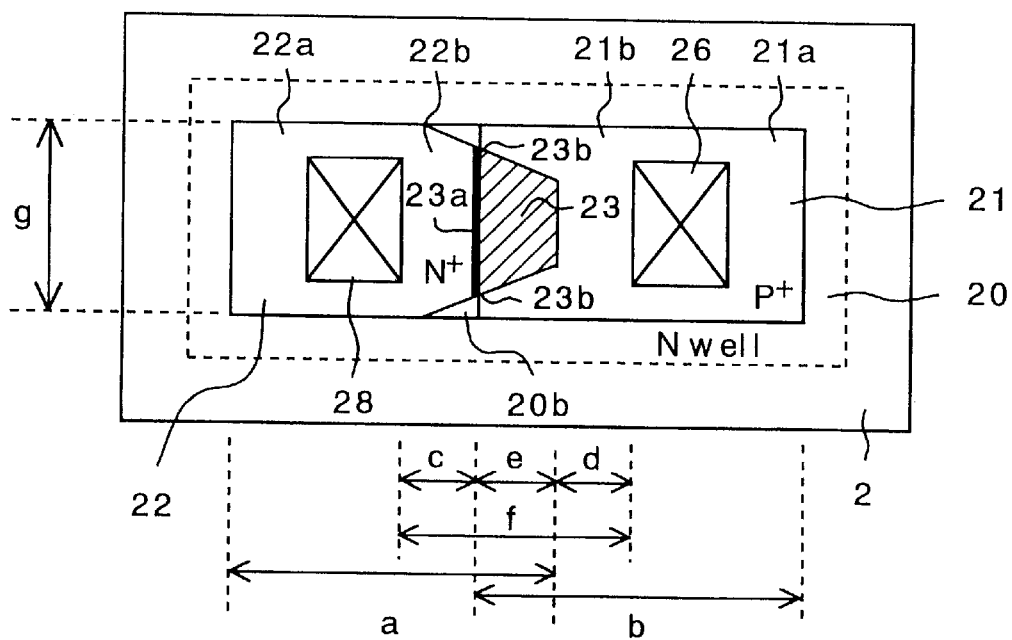
FIGS. 13, 14, 15, 16, 17, and 18 are plan views showing a construction of a Zener diode according to third to eighth embodiments of the present invention, respectively.

FIG. 13 illustrates a third embodiment of the present invention. The third embodiment differs from the first and the second embodiments solely in terms of the shape of the cathode region 22, i.e., the PN junction between the cathode and anode regions 22 and 21. The other aspects of the third embodiment are the same as those of the first and the second embodiments.

Whereas the second embodiment has its cathode region 22 comprising the PN junction forming region 22$b$ with a triangular shape, the cathode region 22 of the third embodiment has a PN junction forming region 22$b$ with a trapezoidal shape. The difference in shape of the region 22$b$ is the only difference between the two embodiments. Of the reference numerals in FIG. 13, those already used in connection with the first and the second embodiments designate like or corresponding parts. The lengths "a" through "g" in FIG. 13 are the same as the lengths "a" through "g" in the first and the second embodiments.

The Zener diode structured as described also has the PN$^+$ junction 23$a$ (shown by thick line in FIG. 13) between the P type superposed region 23 and the N$^+$ type cathode region 22, and the P$^+$N$^+$ junction 23$b$ between the P$^+$ type anode region 21 and the N$^+$ type cathode region 22 located on both ends of the thick line in the figure. The characteristics of the diode are the same as those shown in FIG. 11. The third embodiment thus offers the same effects as the second embodiment; the diode may serve not only as a zapping diode but also as a Zener diode.

In the third embodiment, as in the case of the second embodiment, the cathode region 22 may be higher in impurity concentration than the anode region 21. In another alternative, the cathode region 22 may have a rectangular shape, and the anode region 21 may possess a PN junction forming region 21$b$ with a tapered trapezoidal shape.

Fourth Embodiment

Figure 14:
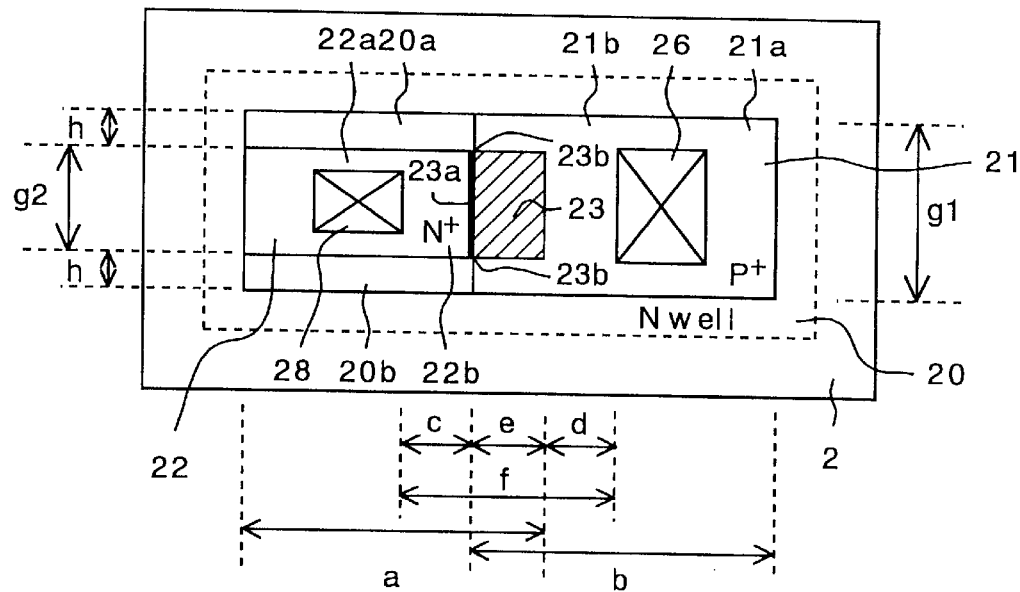

FIG. 14 illustrates a fourth embodiment of the present invention. The fourth embodiment differs from the first embodiment solely in terms of the shape of the cathode region 22, i.e., the PN junction between the cathode and anode regions 22 and 21. The other aspects of the fourth embodiment are the same as those of the first embodiment.

The fourth embodiment has a narrower cathode region 22 (width g2) in the second direction than the first embodiment. In the fourth embodiment, exposed faces 20$a$ and 20$b$ of the diode well region 20 are interposed between the isolation oxide film 2, and those sides of the cathode region 22 which are exposed to the diode well region 20 (exposed N$^+$N junction sides). That specific shape of the PN junction is the only difference between the fourth and the first embodiments.

In the fourth embodiment, the PN junction of the Zener diode including the anode and cathode regions 21 and 22 is thus constituted by the PN$^+$ junction 23$a$ (shown by the thick line in FIG. 14) between the P type superposed region 23 and the N$^+$ type cathode region 22, and by the P$^+$N$^+$ junction 23$b$ between the P$^+$ type anode region 21 and the N$^+$ type cathode region 22 located on both ends of the thick line in the figure. Of the reference numerals in FIG. 14, those already used in connection with the first embodiment designate like or corresponding parts.

The lengths "a" through "f" in FIG. 14, with the exception of the lengths "g1" and "g2", are the same as the lengths "a" through "f" in the first embodiment. The width "g1" of the anode region 21 is the same as the width "g" of the anode region in the first embodiment. The width "g2" of the cathode region 22 in the fourth embodiment is 14 $\mu$m. The distances between the isolation oxide film 2, and those sides of the cathode region 22 which are exposed to the diode well region 20 (exposed N$^+$N junction sides), i.e., the width "h" of the faces 20$a$ and 20$b$ where the diode well region 20 is exposed, are each 3 $\mu$m.

The Zener diode above has, as described, the PN$^+$ junction 23$a$ shown by the thick line between the P type superposed region 23 and the N$^+$ type cathode region 22, and the P$^+$N$^+$ junction 23$b$ between the P$^+$ type anode region 21 and the N$^+$ type cathode region 22 located on both ends of the thick line. The characteristics of the Zener diode in the fourth embodiment, as in the second embodiment, are thus the same as those shown in FIG. 11. It follows that the fourth embodiment also offers the same effects as the second embodiment; the diode may serve not only as a zapping diode but also as a Zener diode.

In the fourth embodiment, as with the second embodiment, the cathode region 22 may be higher in impurity concentration than the anode region 21. In another alternative, the width g1 of the anode region 21 may be less than the width g2 of the cathode region 22.

Fifth Embodiment

Figure 15:
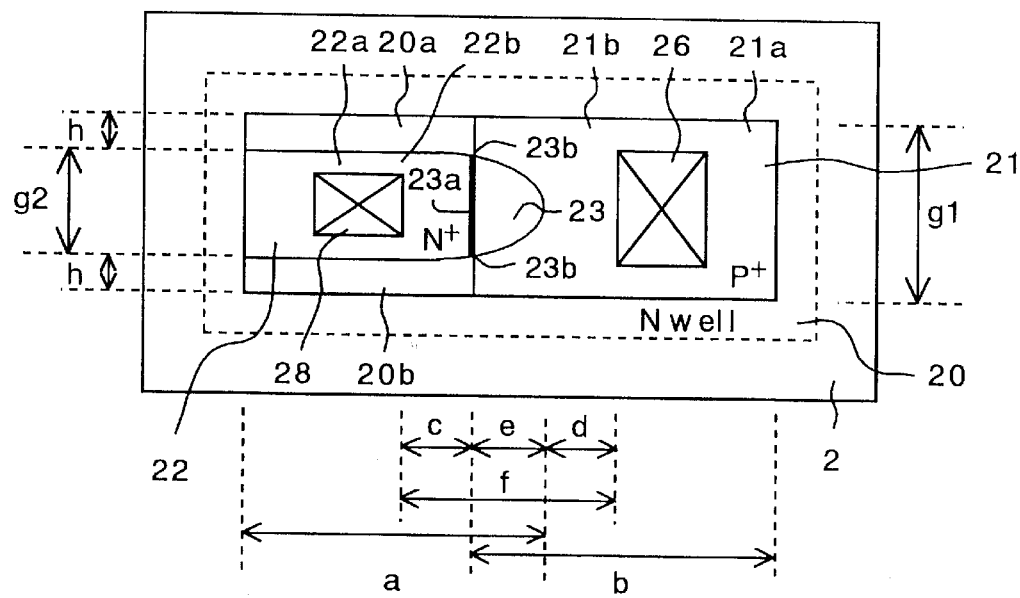

FIG. 15 shows a fifth embodiment of the present invention. The fifth embodiment differs from the first and fourth embodiments solely in terms of the shape of the cathode region 22. The other aspects of the fifth embodiment are the same as those of the first and fourth embodiments.

Whereas the fourth embodiment comprises the cathode region 22 and PN junction forming region 22b, each having a rectangular shape, the fifth embodiment includes the cathode region 22 having a PN junction forming region 22b with a circular arc shape. The difference in shape of the region 22b is the only difference between the fifth and the fourth embodiments. Of the reference numerals in FIG. 15, those already used in connection with the first and fourth embodiments designate like or corresponding parts. The lengths "a" through "f", "g1" and "g2" in FIG. 15 are the same as the lengths "a" through "f", "g1" and "g2" in the fourth embodiment.

The Zener diode described above has the $PN^+$ junction 23a shown by thick line between the P type superposed region 23 and the $N^+$ type cathode region 22, and the $P^+N^+$ junction 23b between the $P^+$ type anode region 21 and the $N^+$ type cathode region 22 located on both ends of the thick line. This means that the characteristics of the Zener diode in the fifth embodiment are the same as those shown in FIG. 11. The fifth embodiment thus offers the same effects as the fourth embodiment above; the diode may serve not only as a zapping diode but also as a Zener diode.

In the fifth embodiment, as with the fourth embodiment, the cathode region 22 may be higher in impurity concentration than the anode region 21. In another alternative, the cathode region 22 may have a rectangular shape, the anode region 21 may be narrower than the cathode region 22, and the PN junction forming region 21b may have a tapered circular arc shape.

Sixth Embodiment

Figure 16:
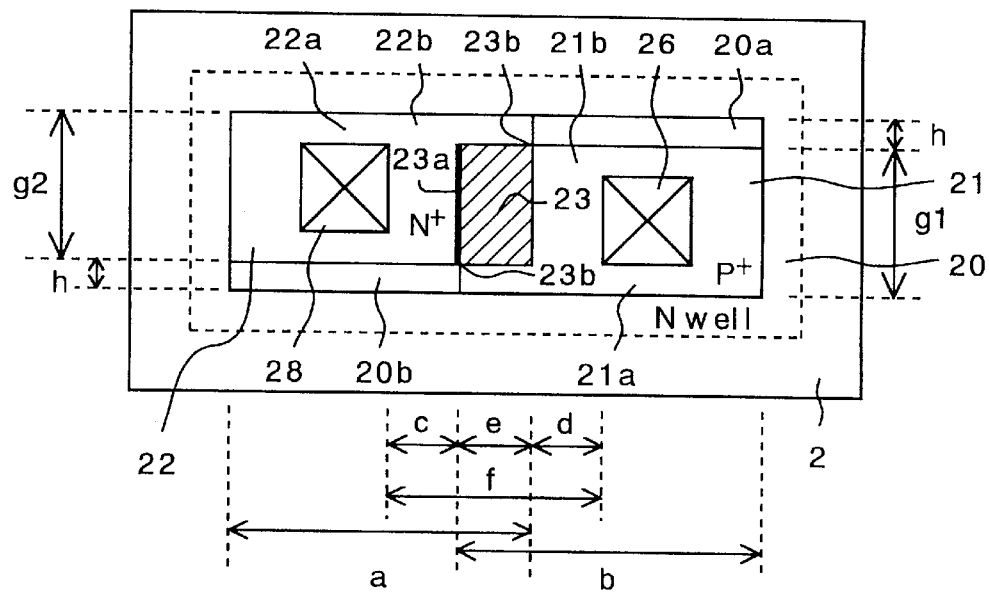

FIG. 16 depicts a sixth embodiment of the present invention. The sixth embodiment differs from the first embodiment solely in terms of the shape of the anode and cathode regions 21 and 22, i.e., the PN junction between the two regions 22 and 21. The other aspects of the sixth embodiment are the same as those of the first embodiment.

The sixth embodiment has a narrower anode region 21 (width "g1") and a narrower cathode region 22 (width "g2"), both in the second direction, than the first embodiment. In the sixth embodiment, an exposed face 20a of the diode well region 20 is interposed in the upper part of FIG. 16 between the isolation oxide film 2, and that side of the anode region 21 which is exposed to the diode well region 20 (exposed $P^+N$ junction side). Likewise, an exposed face 20b of the diode well region 20 is interposed in the lower part of FIG. 16 between the isolation oxide film 2, and that side of the cathode region 22 which is exposed to the diode well region 20 (exposed $N^+N$ junction side). The specific shapes of the PN junction is the only difference between the sixth and first embodiments.

In short, the sixth embodiment comprises the anode and cathode regions 21 and 22, each having a rectangular shape, the two regions being staggered transversely (in the second direction) with respect to each other so that the superposed region 23 therebetween is oriented in the first direction.

As a result, the PN junction of the Zener diode in the sixth embodiment also has two kinds of junctions: the $PN^+$ junction 23a shown by thick line between the P type superposed region 23 and the $N^+$ type cathode region 22, and the $P^+N^+$ junction 23b between the $P^+$ type anode region 21 and the $N^+$ type cathode region 22 located on both ends of the thick line. Of the reference numerals in FIG. 16, those already used in connection with the first embodiment designate like or corresponding parts.

The lengths "a" through "f" in FIG. 16, with the exception of the lengths "g1" and "g2", are the same as the lengths "a" through "f" in the first embodiment. The width "g1" of the anode region 21 and the width "g2" of the cathode region 22 are 17 μm each in the sixth embodiment. The distance in the upper part of FIG. 16 between the isolation oxide film 2, and that side of the anode region 21 which is exposed to the diode well region 20 (exposed $P^+N$ junction side), i.e., the width "h" of the face 20a, where the diode well region 20 is exposed, is 3 μm. Similarly, the distance in the lower part of FIG. 16 between the isolation oxide film 2 on the one hand, and that side of the cathode region 22 which is exposed to the diode well region 20 (exposed $N^+N$ junction side), i.e., the width "h" of the face 20b, where the diode well region 20 is exposed, is also 3 μm.

The Zener diode described above has the $PN^+$ junction 23a shown by the thick line between the P type superposed region 23 and the $N^+$ type cathode region 22, and the $P^+N^+$ junction 23b between the $P^+$ type anode region 21 and the $N^+$ type cathode region 22 located on both ends of the thick line. This means that the characteristics of the Zener diode in the sixth embodiment are the same as those shown in FIG. 11 in connection the second embodiment. The sixth embodiment thus offers the same effects as the second embodiment; the diode may serve not only as a zapping diode but also as a Zener diode. In the sixth embodiment, as in the first embodiment, the cathode region 22 may alternatively be higher in impurity concentration than the anode region 21.

Seventh Embodiment

Figure 17:
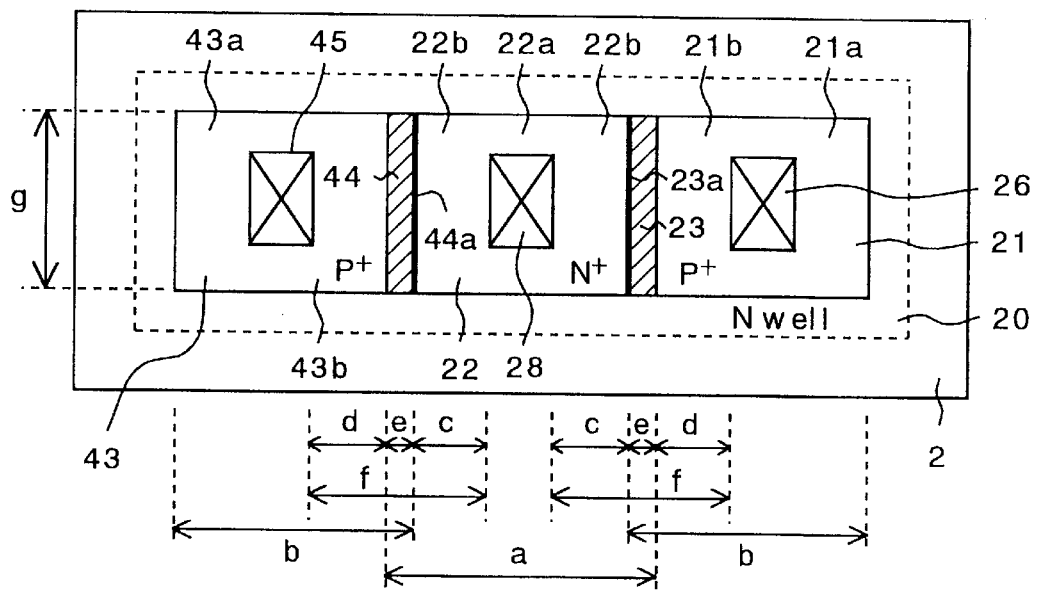

FIG. 17 illustrates a seventh embodiment of the present invention. Whereas the first embodiment has its Zener diode including anode and cathode regions 21 and 22, the seventh embodiment has its Zener diode including a cathode region 22 and two anode regions 21 and 43 flanking the cathode region 22 in the first direction. That structure of the Zener diode is the sole difference between the seventh and first embodiments. The other aspects of the seventh embodiment are the same as those of the first embodiment.

Unlike the first embodiment, the seventh embodiment includes the anode region 43 located on the left-hand side of the cathode region 22, the anode region 43 having the same structure as the anode region 21. The anode region 43 is electrically connected to the anode lead 25 via a contact hole 45 (in ohmic contact). Of the reference numerals in FIG. 17, those already used in connection with the first embodiment designate like or corresponding parts.

In the seventh embodiment, the Zener diode including the anode regions 21 and 43 and the cathode region 22, has an exposed shape with dimensions determined illustratively as follows: the anode regions 21 and 43 are each 17.5 μm long in the first direction in FIG. 17 (length "b"), and 20 μm wide each in the second direction (width "g"). The cathode region 22 is 18 μm long in the first direction (length "a"), and 20 μm wide in the second direction (width "g"). The lengths (distances) "c" in the first direction between the contact hole 28 and the anode regions 21 and 43 are each 8 μm, the same as the length (distance) "d" in the first direction between the contact holes 26 and 45 and the cathode region 22. The superposed regions 23 and 44 between the anode regions 21 and 43 and the cathode region 22 are each 0.5 μm long in the first direction (length "e"). The length (distance) "f" in the first direction between the contact holes 26 and 45 and the contact hole 28 is 16.5 μm.

The Zener diode described above has two partially superposed regions 23 and 44. The superposed region 23 is formed along the first direction between the anode and cathode regions 21 and 22, and the superposed region 44 is disposed in the first direction between the anode region 43 and the cathode region 22. Because the anode regions 21 and 43 are higher in impurity concentration than the cathode region 22 in the seventh embodiment, the superposed regions 23 and 44 are each P type. It follows that the PN junction of the Zener diode made of the anode regions 21 and 43 and of the cathode region 22 comprises $PN^+$ junctions 23a and 44a (shown by thick line in FIG. 17) between the P type superposed regions 23 and 44, and the $N^+$ type cathode region 22.

When measured, the Zener diode of the seventh embodiment, as in the case of the first embodiment, yielded the same characteristics as those shown in FIG. 3. In one experiment, a large current was made to flow from the zapping cathode pad PK to the zapping anode pad PA. This, as with the first embodiment, short-circuited the cathode and anode leads of the Zener diode. The resistance measured at that point in the same manner as in the first embodiment turned out to be as low as 9.5 Ω. With a resistance between the cathode and anode leads 27 and 25 as low as several ohms, a practically short-circuited state was brought about between the cathode and anode leads 27 and 25.

The Zener diode described above provides the same effects as those of the first embodiment and, with the cathode region 22 superposed on both sides on the anode regions 21 and 43 to form the superposed regions 23 and 44, offers additional benefits as follows: because of the reduced resistance between the cathode and anode leads 27 and 25, the distances in the first direction between the contact holes 26 and 45 and the contact hole 28 (length "f") may be shortened, i.e., the superposed regions 23 and 44 may be shorter than before (length "e"). Even if there occurs in the manufacturing process a misalignment of the mask for fabricating the cathode region 22 and the anode regions 21 and 43, at least one of the superposed regions 23 and 44 is formed unfailingly to permit Zener diode formation. As a result, it is easy to destroy the Zener diode between the cathode and anode leads 27 and 25, and the resistance between the leads 27 and 25 is made very low.

In the seventh embodiment, as with the first embodiment, the cathode region 22 may alternatively be higher in impurity concentration than the anode region 21. While the seventh embodiment has the $N^+$ type cathode region 22 flanked on both sides by the $P^+$ type anode regions 21 and 43, an alternative has a $P^+$ type anode region 21 flanked on both sides by $N^+$ type cathode regions 22. The latter setup, when implemented, still provides the same effects as the seventh embodiment.

Eighth Embodiment

Figure 18:
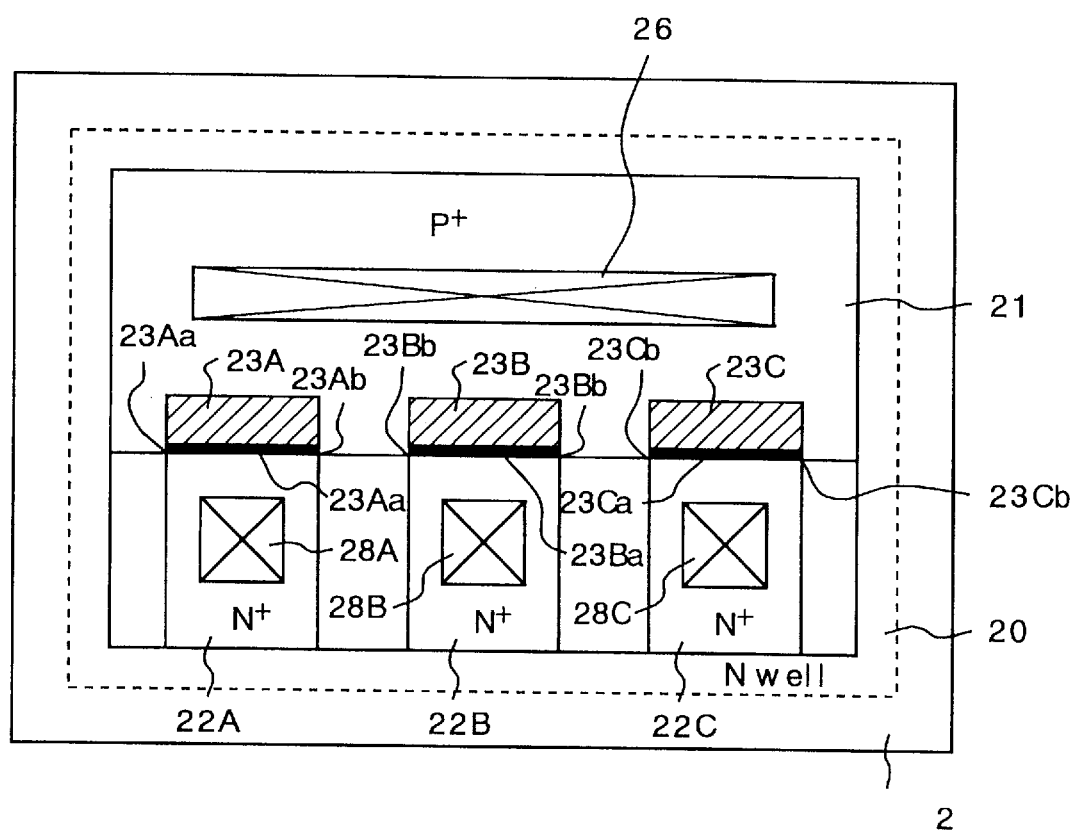

FIG. 18 shows an eighth embodiment of the present invention. The eighth embodiment is characterized by a plurality of Zener diodes such as in the first embodiment (ZD1 through ZD3, three Zener diodes discussed in conjunction with the first embodiment and shown in FIGS. 4 and 5) sharing an anode region 21. The other aspects of the eighth embodiment are the same as those of the first embodiment. That is, the eighth embodiment comprises in the diode well region 20 the anode region 21 common to a plurality of Zener diodes and a plurality of cathode regions 22A through 22C corresponding to the plurality of Zener diodes.

The cathode regions 22A through 22C are arranged in parallel in the second direction (transversely in FIG. 18). The cathode regions 22A through 22C are each superposed partially on the anode region 21 in the first direction (longitudinally in FIG. 18), thus constituting partially superposed regions 23A through 23C. In the eighth embodiment, the superposed regions 23A through 23C are each P type because the anode region 21 is higher in impurity concentration than the cathode regions 22A through 22C. This means that the multiple Zener diodes have two kinds of PN junctions: $PN^+$ junctions 23Aa through 23Ca (shown by thick line in FIG. 18) between the P type superposed regions 23A through 23C and the $N^+$ type cathode regions 22A through 22C, and $P^+N^+$ junctions 23Ab through 23Cb between the $P^+$ type anode region 21 and the $N^+$ type cathode regions 22A through 22C located on both ends of the thick lines each. Of the reference numerals in FIG. 18, those already used in connection with the first embodiment designate like or corresponding parts.

When measured, each of the multiple Zener diodes described above yielded the same characteristics as those shown in FIG. 11. That is because the cathode regions 22A through 22C and the anode region 21 make up the same structure as that of the third embodiment shown in FIG. 14. The eighth embodiment thus provides the same effects as the first embodiment and, with the anode region 21 shared by a plurality of zapping diodes as shown in FIGS. 4 and 5, offers an additional benefit of minimizing the area occupied by the zapping diodes.

In the eighth embodiment, as with the first embodiment, the cathode regions 22A through 22C may alternatively be higher in impurity concentration than the anode region 21. In other alternatives, the PN junction forming region 22b in the cathode regions 22A through 22C may have a triangular shape similar to that of the second embodiment in FIG. 10, a trapezoidal shape such as that of the third embodiment in FIG. 13, or a circular arc shape like that of the fifth embodiment in FIG. 15.

Ninth Embodiment

Figure 19:
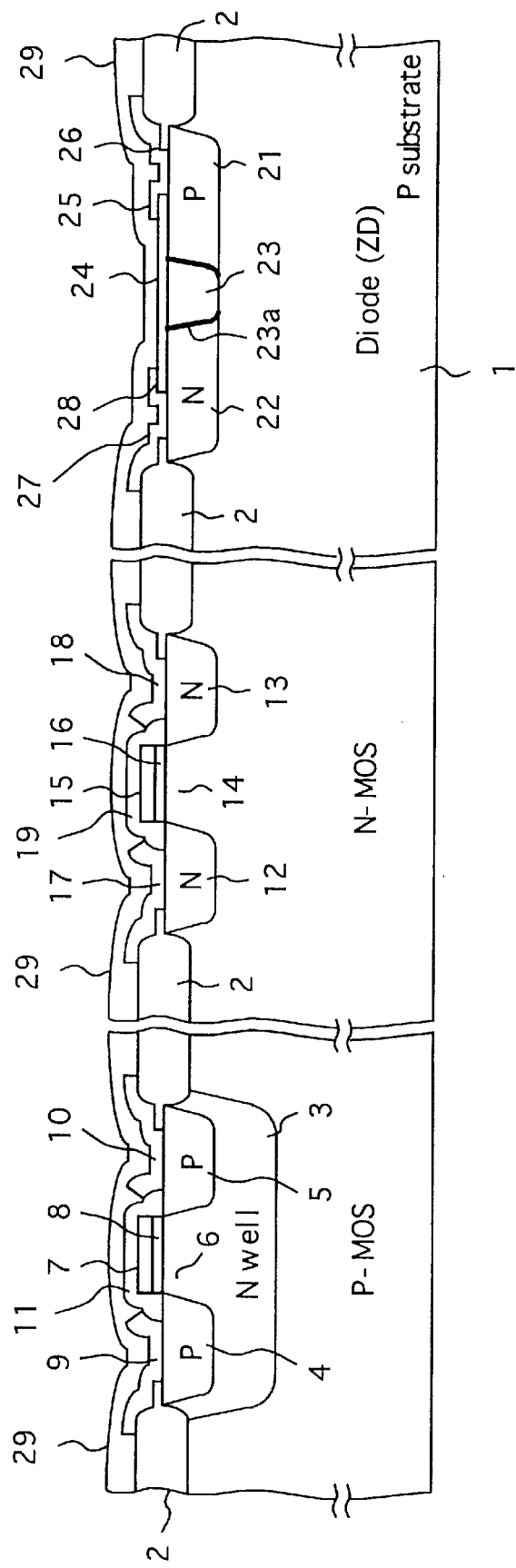
FIGS. 19 to 21 are cross sectional views showing a construction of a semiconductor integrated circuit device according to ninth to eleventh embodiments of the present invention respectively.

FIG. 19 shows a ninth embodiment of the present invention. Whereas the first embodiment has the anode and cathode regions 21 and 22 in the diode well region 20 at the principal surface of the semiconductor substrate 1 (the anode and cathode regions 21 and 22 making up the zapping diode (ZD)), the ninth embodiment has the anode and cathode regions 21 and 22 directly at the principal surface of the semiconductor substrate 1, i.e., without the intervention of a diode well region 20. The other aspects of the ninth embodiment are the same as those of the first embodiment. Of the reference numerals in FIG. 19, those already used in connection with the first embodiment designate like or corresponding parts.

The semiconductor integrated circuit device described above provides the same effects as the first embodiment. It should be noted that the anode region 21 is of the same conductivity type as the semiconductor substrate 1 and is thus connected to ground potential through the substrate 1. Where the ninth embodiment is used as a zapping diode of a resistance element, the node on the other side of the element shown in FIGS. 4 and 5 is therefore fed with ground potential. In such a case, the resistance element comprising the inventive zapping diode may serve as an element with one of its terminals establishing a reference potential and with the other terminal connected to ground potential.

In the ninth embodiment, as with the first embodiment, the cathode region 22 may alternatively be higher in impurity concentration than the anode region 21. In other alternatives, the anode and cathode regions 21 and 22 may each have any one of the shapes specific to the second through the eighth embodiments.

Tenth Embodiment

Figure 20:
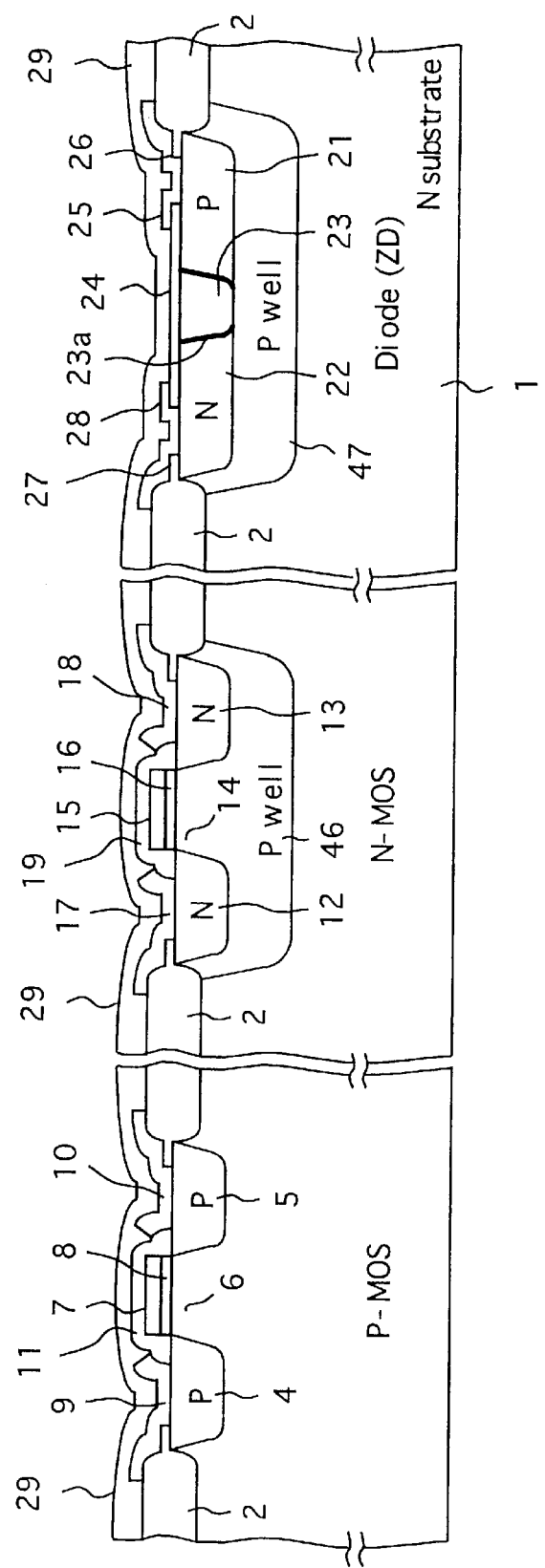

FIG. 20 shows a tenth embodiment of the present invention. Whereas the first embodiment uses a P type semiconductor substrate 1, the tenth embodiment employs an N type semiconductor substrate. The type of the semiconductor substrate is the sole difference between the tenth and the first embodiments. The other aspects of the tenth embodiment are the same as those of the first embodiment.

Specifically, the semiconductor substrate 1 is fed with a positive potential to provide P type MOS transistors with a substrate potential. A pair of source and drain regions 4 and 5 making up a P type MOS transistor are formed at the principal surface of the semiconductor substrate. A pair of source and drain regions 12 and 13 constituting an N type MOS transistor are disposed in a P type NMOS well region 46 at the principal surface of the semiconductor substrate. The NMOS well region 46 is fed with ground potential to provide N type MOS transistors with the substrate potential. An anode region 21 and a cathode region 22 making up a Zener diode are formed in a P type diode well region 47 at the principal surface of the semiconductor substrate. The diode well region 47 is placed in an electrically floating state. Of the reference numerals in FIG. 19, those already used in connection with the first embodiment designate like or corresponding parts.

The semiconductor integrated circuit device described above provides the same effects as the first embodiment. In the tenth embodiment, as in the case of the first embodiment, the cathode region 22 may be higher in impurity concentration than the anode region 21 and vice versa. In other alternatives, the anode and cathode regions 21 and 22 may each have any one of the shapes specific to the second through the eighth embodiments.

Eleventh Embodiment

Figure 21:
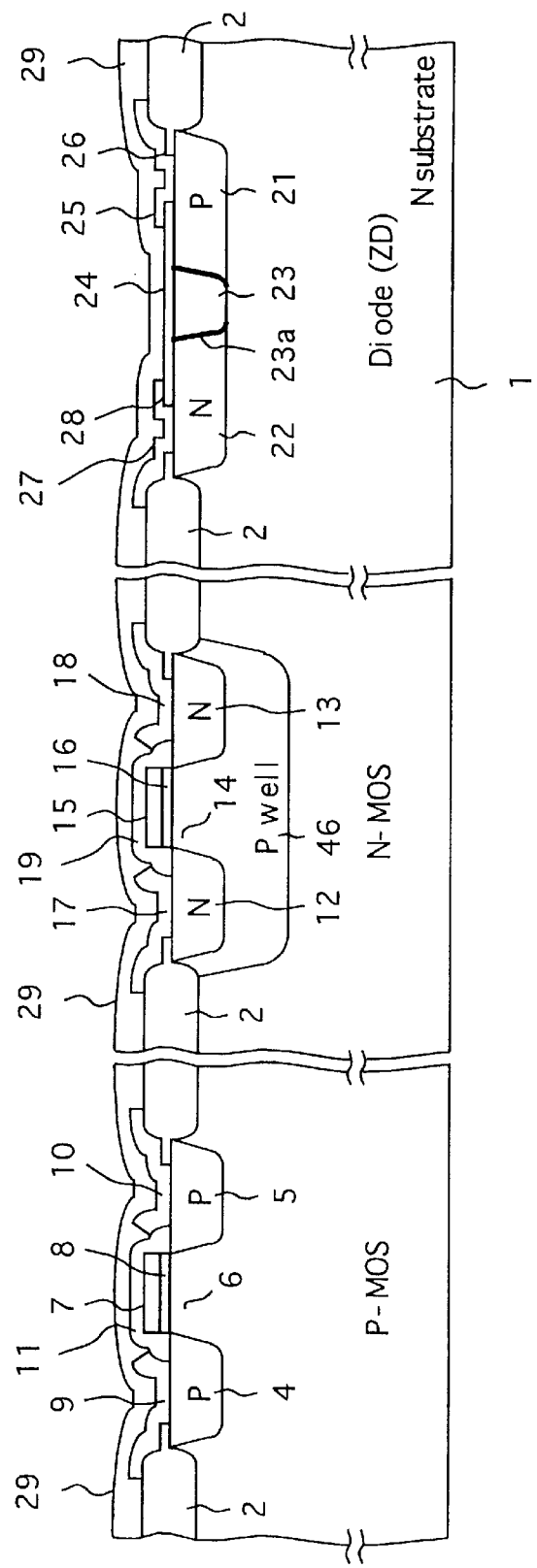
Figure 22:
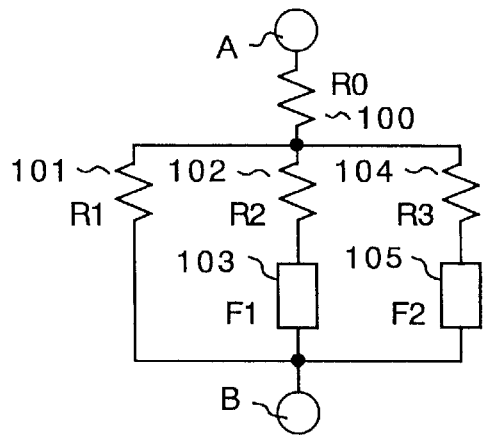
FIGS. 22, 23, and 24 show an initial, first, and second states of the conventional circuit for a very high precision resistance.
Figure 23:
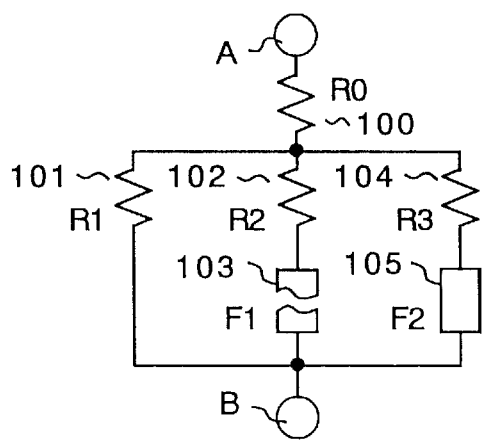
Figure 24:
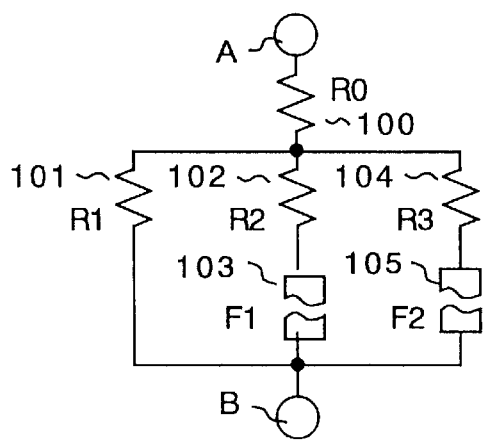

FIG. 21 illustrates an eleventh embodiment of the present invention. Whereas the tenth embodiment has the anode and cathode regions 21 and 22 in the diode well region 47 on the principal surface of the semiconductor substrate 1 (the anode and cathode regions 21 and 22 making up the zapping diode, the eleventh embodiment has the anode and cathode regions 21 and 22 formed directly at the principal surface of the semiconductor substrate 1, i.e., without the intervention of a diode well region 47. The other aspects of the eleventh embodiment are the same as those of the tenth embodiment. Of the reference numerals in FIG. 21, those already used in connection with the tenth embodiment designate like or corresponding parts.

The semiconductor integrated circuit device described above provides the same effects as the first embodiment. In the eleventh embodiment, as with the tenth embodiment, the cathode region 22 may be higher in impurity concentration than the anode region 21 and vice versa. In other alternatives, the anode and cathode regions 21 and 22 may each have any one of the plane shapes specific to the second through the eighth embodiments. Obviously many modifications and variations of the present invention are possible in the light of the foregoing teachings. It is therefore to be understood that, within the scope of the appended claims, the invention may be practiced otherwise than as specifically described.

What is claimed is:

1. A semiconductor integrated circuit device comprising:
    a semiconductor substrate having a principal surface;
    a P type MOS transistor having P type source and drain regions in said semiconductor substrate at the principal surface of said semiconductor substrate;
    an N type MOS transistor having N type source and drain regions in said semiconductor substrate at the principal surface of said semiconductor substrate;
    a zapping diode having an anode region and a cathode region, said anode region being a P type region located at the principal surface of said semiconductor substrate and having an impurity concentration and a depth the same as said P type source and drain regions of said P type MOS transistor, said cathode region being an N type region located at the principal surface of said semiconductor substrate and having an impurity concentration and a depth the same as said N type source and drain regions of said N type MOS transistor, said cathode region being partially superposed on said anode region;
    a zapping anode pad located at the principal surface of said semiconductor substrate and connected electrically to said anode region of said zapping diode; and
    a zapping cathode pad located at the principal surface of said semiconductor substrate and connected electrically to said cathode region of said zapping diode.

2. The semiconductor integrated circuit device according to claim 1, wherein one of said anode region and said cathode region is narrower than the other region where said anode and cathode regions are partially superposed on each other.

3. The semiconductor integrated circuit device according to claim 1, wherein:
    one of said anode region and said cathode region of said diode has a contact region for electrical connection and a tapered region forming a PN junction, said tapered region extending from said contact region on the principal surface of said semiconductor substrate; and
    the other one of said anode region and said cathode region of said diode has a contact region for electrical connection and a PN junction region extending from said contact region on the principal surface of said semiconductor substrate and partially superposed on said tapered region forming a PN junction.

4. The semiconductor integrated circuit device according to claim 3, wherein said tapered region has a triangular shape.

5. The semiconductor integrated circuit device according to claim 3, wherein said tapered region has a trapezoidal shape.

6. The semiconductor integrated circuit device according to claim 1, wherein said anode region and said cathode region of said diode each have a rectangular shape, and one of said anode region and said cathode region is narrower than the other region, and said anode and cathode regions are partially superposed on each other, the partial superposition being perpendicular to widths of said anode and cathode regions.

7. The semiconductor integrated circuit device according to claim 3, wherein said tapered region has a circular arc shape.

8. The semiconductor integrated circuit device according to claim 1, wherein said anode region and said cathode region of said diode each have a substantially rectangular shape, and said anode region and said cathode region are partially superposed on each other in a transversely staggered manner, the partial superposition being perpendicular to widths of said anode and cathode regions.

9. The semiconductor integrated circuit device according to claim 1, wherein one of said anode region and said cathode region of said diode comprises a pair of regions extending over the principal surface of said semiconductor substrate and flanking the other one of said anode region and said cathode region.

10. The semiconductor integrated circuit device according to claim 1, wherein said diode includes a plurality of diode parts corresponding to a plurality of cathode region parts of said cathode region, and wherein each of said cathode region parts is disposed on the principal surface and is partially superposed on said anode region, said anode region being common to said plurality of diode parts.

11. The semiconductor integrated circuit device according to claim 1, wherein said semiconductor substrate is a P type semiconductor substrate including an N type well region at the principal surface of said semiconductor substrate, wherein said anode region and said cathode region of said diode are located within said N type well region, and the impurity concentration of said cathode region is higher than that of said N type well region.

12. The semiconductor integrated circuit device according to claim 1, wherein said semiconductor substrate is a P type semiconductor substrate, and wherein the impurity concentration of said anode region is higher than that of said semiconductor substrate.

13. The semiconductor integrated circuit device according to claim 1, wherein said semiconductor substrate is an N type semiconductor substrate including a P type well at the principal surface of said semiconductor substrate, wherein said anode region and said cathode region of said diode are located within said P type well region, and the impurity concentration of said anode region is higher than that of said P type well region.

14. The semiconductor integrated circuit device according to claim 1, wherein said semiconductor substrate is an N type semiconductor substrate, and the impurity concentration of said cathode region is higher than that of said semiconductor substrate.

* * * * *